United States Patent [19]

Suzuki

[11] Patent Number: 4,622,655
[45] Date of Patent: Nov. 11, 1986

[54] SEMICONDUCTOR MEMORY

[75] Inventor: Shunichi Suzuki, Tokyo, Japan

[73] Assignee: NEC Corporation, Tokyo, Japan

[21] Appl. No.: 607,026

[22] Filed: May 4, 1984

[30] Foreign Application Priority Data

May 4, 1983 [JP] Japan .................................. 58-78768

[51] Int. Cl.[4] ............................................. G11C 11/24
[52] U.S. Cl. .................................... 365/149; 365/210; 365/208
[58] Field of Search ............... 365/149, 203, 205, 210, 365/208

[56] References Cited

U.S. PATENT DOCUMENTS 4,044,340  8/1977  Itoh .................................... 365/208
4,363,111  12/1982  Heightley et al. .................. 365/210

FOREIGN PATENT DOCUMENTS

WO/8103568  12/1981  PCT Int'l Appl. .

Primary Examiner—Joseph A. Popek
Attorney, Agent, or Firm—Sughrue, Mion, Zinn, Macpeak, and Seas

[57] ABSTRACT

A semiconductor memory has at least a pair of bit lines, a plurality of word lines crossing the pair of bit lines, a pair of dummy word lines crossing the pair of bit lines, memory cells arranged at intersections between the bit lines and the word lines, dummy cells arranged at intersections between any the bit lines and the dummy word lines, a sense amplifier connected to the pair of bit lines, and a means for equalizing the potentials of the pair of bit lines. Each of the memory cell has a transistor and a capacitor. Each dummy cell has the same construction as each memory cell. The pair of bit lines and dummy cell capacitors are electrically connected at a predetermined timing and are set at a third voltage, the corresponding dummy cell is disconnected from one of the bit line pair, to which a selected memory cell capacitor is connected. Subsequently, a voltage difference between voltages on the bit lines is detected.

11 Claims, 8 Drawing Figures

SEMICONDUCTOR MEMORY

BACKGROUND OF THE INVENTION

The present invention relates to a semiconductor memory and, more particularly, to a random access memory IC.

The memory capacity of semiconductor memories has been increased recently. 64K-bit memories are already commercially available, and 256K-bit memories are now being developed and applied in practice. The major problem in the development of large-capacity memories lies in the fact that noise is generated due to increases and variations in bit-line capacitances, thereby resulting in erroneous access. In addition to this disadvantage, power consumption is increased. The present invention has been made to overcome these conventional drawbacks.

FIG. 1 is a circuit diagram showing the main part of a conventional one-transistor type MIS (metal-insulator-semiconductor structure) memory. A pair of bit lines B and $\bar{B}$ are connected to nodes ⓐ and ⓑ, respectively, of a sense amplifier SA. A word line W0 and a dummy word line DW0 cross the bit line $\bar{B}$, and a word line W1 and a dummy word line DW1 cross the bit line B. A memory cell M0 and a dummy cell DM0 are arranged at the intersections of the bit line $\bar{B}$ and the word line W0 and that of the bit line $\bar{B}$ and the dummy line DW0, respectively. Similarly, a memory cell M1 and a dummy cell DM1 are arranged at the intersections of the bit line B and the word line W1 and that of the bit line B and the dummy line DW1. It should be noted that only a single word line W0 and W1 is represented for a bit line B or $\bar{B}$ for illustrative convenience, but in practice a plurality of word lines are provided for each bit line. It should also be noted that the memory cells M0 and M1 and the dummy cells DM0 and DM1 each have the same capacitor C0 and the same selection transistor Q0.

To access the memory cell M0 in the conventional memory, for example, a pulse is simultaneously supplied to the word line W0 and the dummy word line DW1. Small differential readout signals from the memory cell M0 and the dummy cell DM1 appear on the bit lines $\bar{B}$ and B and are detected and amplified by the sense amplifier SA in response to a latching clock $\phi L$ in order to determine whether the readout data is set at logic "0" or "1". A voltage applied to the capacitor C0 of the dummy cell DM1 is set by a reference voltage generator Gref at an intermediate level of the voltages corresponding to the data of logic "1" and "0" which are stored in the capacitor C0 of the memory cell M0. Therefore, the voltage appearing on the bit line B upon read access of the dummy cell DM1 has an intermediate level between that of logic "1" and "0". A difference between this intermediate value and the voltages corresponding to the readout data of logic "1" and "0" from the memory cell M0 and appearing on the bit line $\bar{B}$ become differential signals of opposite polarities.

Since these differential signals are charge-divided by the bit line capacitances, the differential signals corresponding to the differences in stored voltages between a voltage of 5 V (corresponding to the data of "1") and an intermediate voltage of 2.5 V and between a voltage of 0 V (corresponding to the data of "0") and the intermediate voltage of 2.5 V will not be set at ±2.5 V. In practice, the differential signals will be about +0.3 V, i.e., about 1/10 of the stored differential voltages of +2.5 V. The differential signal output voltage $\Delta VB$ can be approximated as follows:

$$\Delta VB = V\bar{B}' - VB' = \{C0(VS - VS')\}/(C0 + CB) \quad (1)$$

$$\text{for } V\bar{B}' = (C0 \cdot VS + CB \cdot VB)/(C0 + CB)$$

$$VB' = (C0 \cdot VS' + CB \cdot VB)/(C0 + CB)$$

where $VB'$ and $V\bar{B}'$ are the voltages at the bit lines B and $\bar{B}$ after the corresponding word lines W0 and W1 are opened, respectively, and VB is the voltage at the bit line B or $\bar{B}$ before the corresponding word line W0 or W1 is opened. Further, VS and VS' are the stored voltages at the memory cell M0 and the dummy cell DM1, respectively, before the corresponding word line is opened, and CB is the bit line capacitance which includes the gate capacitance of the memory cell, the diffusion capacitance of the substrate, the input capacitance of the sense amplifier, and the coupling capacitance with other wires. The bit line capacitance CB is generally about 10 times larger than the memory cell capacitance C0 and is the main cause for the decrease in the differential signal output voltages.

A number of bit lines cross each word line. The readout signals from the memory cells appear on the corresponding bit lines. The readout signal on a given bit line causes generation of noise on all other bit lines due to inherent capacitive coupling and capacitive couplings between the bit line and the substrate and between the bit line and the word line. Therefore, the signals on the bit lines B and $\bar{B}$ are unbalanced. As a result, the possible detection range of the differential signal output voltages is narrowed, and the sense amplifier is erroneously operated.

In the conventional memory shown in FIG. 1, stable operation of the memory is adversely affected by coupling noise associated with the bit line.

In order to solve this problem, a folded bit line type memory is disclosed in U.S. Pat. No. 4,044,340. FIG. 2 is a circuit diagram of this memory cell. The same reference numerals used in FIG. 2 denote the same parts in FIG. 1.

In this improved memory shown in FIG. 2, a pair of bit lines B and $\bar{B}$ are parallel to each other and are connected at one of the sides of a sense amplifier SA unlike the arrangement of FIG. 1 wherein the bit lines B and $\bar{B}$ are connected to both sides of the sense amplifier SA, and memory cells and dummy cells are symmetrically arranged at intersections of the bit and word lines.

The noise associated with the inherent capacitive coupling between the bit lines in FIG. 1 can be substantially eliminated. The coupling capacitances between the respective word lines and the corresponding bit lines differ in accordance with the presence/absence of a memory cell. When a given memory cell is accessed, a dummy cell on the side of a nonselected memory cell is accessed to prevent imbalance of the signals read out onto the bit lines B and $\bar{B}$.

However, according to both these conventional memories, the bit line is precharged with a power supply voltage VDD, so that power consumption is pretty large.

A conventional low-power consumption memory is disclosed in PCT International Publication No. WO81/03568 wherein the power consumption can be decreased by 50% since the bit lines are precharged with a voltage of VDD/2, and the dummy cells are omitted. FIG. 3 is a circuit diagram of this memory. The same reference numerals used in FIG. 3 denote the same parts in FIGS. 1 and 2.

Assume that a memory cell M0 is selected and data is read out therefrom in the circuit shown in FIG. 3. Since transistors Q10 and Q11 are turned on in response to a clock $\phi P0$, bit lines B and $\overline{B}$ are precharged with an intermediate voltage (to be referred to as VDD/2 although the intermediate voltage slightly differs from VDD/2) between the power supply voltage VDD and the ground potential. When the memory cell M0 is selected and data of logic "1" has been written therein, the voltage at the bit line $\overline{B}$ increases to an intermediate level between VDD/2 and VDD. However, when data of logic "0" has been written in the memory cell M0, the voltage at the bit line $\overline{B}$ decreases to an intermediate value between VDD/2 and the ground potential. In the following description, it is assumed that the memory cell M0 stores data of logic "1". When a clock $\phi s$ goes low, the sense amplifier SA starts to decrease the lower voltage at the bit line B to the ground potential, thereby allowing detection of a difference between voltages at the bit lines B and $\overline{B}$. Subsequently, the bit line $\overline{B}$ is precharged by a pull-up circuit PU to the VDD level, so that data rewriting is performed. The bit lines B and $\overline{B}$ are held in the floating state, and are connected to be kept at the initial intermediate voltage VDD/2.

According to the circuit shown in FIG. 3, the dummy cells required for the respective bit lines can be omitted. In addition, the precharge voltages at the bit lines become substantially VDD/2. As a result, a densely-packed semiconductor memory on a small chip can be obtained with power consumption substantially ½ that of the conventional memory.

However, several problems are still presented by the memory shown in FIG. 3. First, since the dummy cells are omitted, the difference between the capacitances of the bit lines B and $\overline{B}$ is increased unlike in the conventional arrangement wherein the bit line capacitances are balanced by the combination of the memory and dummy cells. Since no measure is taken against noise generated by a coupling capacitance between the bit line and the word line, erroneous operation may be occurred by the noise. Second, since the capacitances of the pair of bit lines are unbalanced, the sense amplifier cannot be directly coupled to the bit lines. As a result, the bit lines $\overline{B}$ and B must be connected to the sense amplifier through the transistors Q8 and Q9, respectively. Alternatively, a complex pull-up circuit must be used.

SUMMARY OF THE INVENTION

It is an object of the present invention to provide a stable, low-power semiconductor memory which is free from the common noise associated with the bit line and caused by unbalanced capacitances of the bit lines and the word line coupling noise caused by a coupling capacitance between the word line and the bit line, and whose bit lines are precharged with a voltage of VDD/2.

It is another object of the present invention to provide a stable semiconductor memory wherein the influence of noises due to leakage current or alpha particles with respect to bit lines can be decreased.

It is still another object of the present invention to provide a high-performance semiconductor memory wherein the bit lines can be precharged at high speed with low power consumption.

In order to achieve the above object of the present invention, there is provided a semiconductor memory comprising: (a) at least a pair of bit lines; (b) a plurality of word lines and a pair of dummy word lines which cross the pair of bit lines; (c) memory cells arranged in the vicinities of intersections of one of the pair of bit lines and the plurality of word lines, each of the memory cells including a transistor, a gate of which is connected to a corresponding one of the plurality of word lines, a first terminal of which is connected to a corresponding one of the pair of bit lines and a second terminal of which is connected to a capacitive element, and each memory cell being arranged to store one of first and second voltage states in response to a write signal; (d) a pair of dummy cells respectively coupled to the pair of bit lines, each of the dummy cells having substantially the same construction as each memory cell; (e) means for connecting the pair of bit lines to each other at a predetermined timing when both of the capacitive elements in the pair of the dummy cells are connected to the pair of bit lines so as to set the pair of bit lines at a third voltage state; (f) means, responsive to an address signal, for connecting a capacitive element in a selected one of the memory cells to one of the pair of bit lines by means of a selected one of the word lines and disconnecting the capacitive element in one of the dummy cells from that one of the pair of bit lines while maintaining the connection between the capacitive element in the other dummy cell and the other of the pair of bit lines; and (g) means for differentially detecting signals on the pair of bit lines. The memory may further comprise means for connecting the disconnected dummy cell capacitor to the one of the pair of bit lines after the signals on the pair of bit lines are detected; means for feedback-amplifying the signals on the pair of bit lines and setting one of the pair of bit lines at a fourth voltage state and the other of the pair of bit lines at a fifth voltage state; and means for disconnecting the capacitive element of the selected memory cell from the one of the pair of bit lines after the signals on the pair of bit lines are amplified. The pair of bit lines are set at the third voltage state immediately after the memory receives an access signal or after the memory has performed a read operation.

In the latter case, the memory sets the pair of bit lines at the third voltage state after the selected memory cell capacitor is disconnected from the corresponding bit line.

The memory cell further includes means for connecting the second terminals of the transistors in the dummy cells to each other.

DETAILED DESCRIPTION OF THE PREFERRED EMBODIMENTS

The present invention will now be described in detail with reference to the accompanying drawings.

Figure 4:
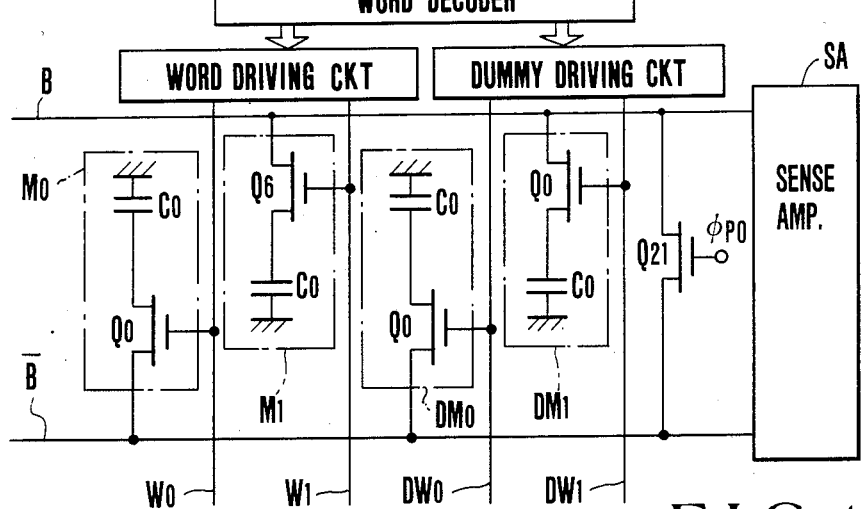
FIG. 4 is a circuit diagram showing the main part of a semiconductor memory according to an embodiment of the present invention.
Figure 5:
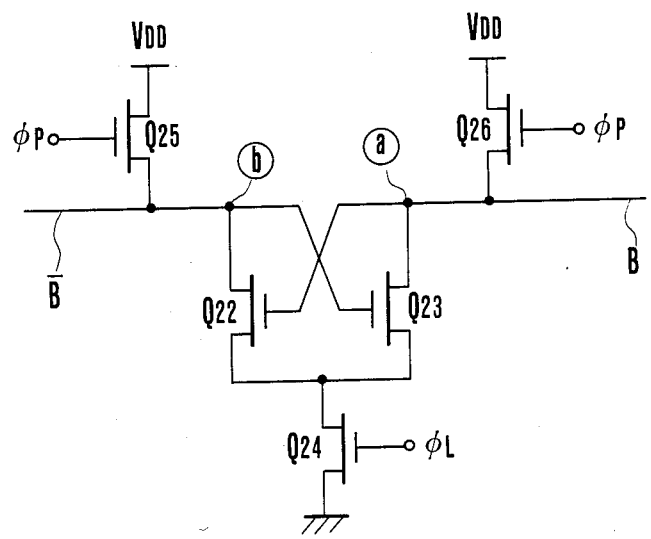
FIG. 5 is a circuit diagram showing a sense amplifier in the memory shown in FIG. 4.

FIG. 4 is a circuit diagram showing the main part of a semiconductor memory according to an embodiment of the present invention, and FIG. 5 is a circuit diagram showing a sense amplifier SA thereof. The same reference numerals used in FIGS. 4 and 5 denote the same parts as in the conventional memories, and a detailed description thereof will thus be omitted.

A pair of bit lines B and $\bar{B}$ which are substantially parallel to each other are connected to one of the sides of a sense amplifier SA. Word lines W0 and W1 (n word lines are included although only two lines are illustrated in FIG. 4) and a pair of dummy word lines DW0 and DW1 cross the parallel bit lines B and $\bar{B}$. A memory cell M0 consisting of a selection transistor Q0 and a memory capacitor C0 is arranged in the vicinity of an intersection of the bit line $\bar{B}$ and the word line W0. The drain or source of the transistor Q0 is connected to the bit line $\bar{B}$, and the gate thereof is connected to the word line W0. Similarly, a memory cell M1 is arranged in the vicinity of the intersection of the bit line B and the word line W1; a dummy cell DM0, near that of the bit line $\bar{B}$ and the dummy word line DW0; and a dummy cell DM1, near that of the bit line B and the dummy word line DW1. The dummy word lines DW0 and DW1 normally make the transistors Q0 in the dummy cells ON, so that the dummy cell capacitors C0 are normally connected to the bit lines $\bar{B}$ and B, respectively. A transistor Q21 is inserted between the bit lines B and $\bar{B}$ so as to connect the bit lines B and $\bar{B}$ to each other in response to a clock $\phi$P0.

FIG. 5 shows a typical sense amplifier. Any type of sense amplifier can be used in the memory of the present invention.

The operation of the memory will now be described with reference to the timing chart shown in FIG. 6. By way of simplicity, assume that the memory M0 stores data of logic "1" and is subjected to read access.

In response to the activation of a row address clock $\overline{RAS}$ (or low level), a bit line capacitance equalizing clock $\phi$P0 is applied to the transistor Q21. As a result, the transistor Q21 is turned on, and the bit lines B and $\bar{B}$ are connected therethrough. The VDD potential at the bit line $\bar{B}$ and the ground potential at the bit line B are equalised to set the bit lines B and $\bar{B}$ at the predetermined voltage VDD/2 (although in practice the bit lines are set at a voltage near, but not exactly, VDD/2, the predetermined voltage is given as VDD/2 by way of simplicity). In this case, the dummy cells DM0 and DM1 whose capacitors are connected to the bit lines B and $\bar{B}$ are also precharged with the voltage VDD/2. Following activation of the $\overline{RAS}$ signal, word address signals are applied to a word decoder which selects one of the word lines (W0 in this case) and one of the dummy word lines (DW0 in this case). Selection of the dummy word lines is completed faster than that of the word lines because the number of the dummy word lines connected to the dummy word driving circuit is two and at a timing one of them is merely selected while to the word driving circuit, a plurality of word lines are connected so that the load of the word driving circuit becomes larger than that of the dummy word driving circuit. The selected dummy word line DW0 goes low by means of a dummy word driving circuit to disconnect the capacitor C0 of the dummy memory cell DM0 from the bit line $\bar{B}$. Then the selected word line W0 goes high by means of the word driving circuit to connect the capacitor C0 of the memory cell M0 to the bit line $\bar{B}$. As a result, the voltage at the bit line $\bar{B}$ becomes slightly higher than the voltage VDD/2 since the charge of the bit line capacitance and the charge of the cell capacitor C0 serve as a total charge of the bit lines. On the other hand, the voltage at the bit line B is kept set at VDD/2, because no change in capacitance occurs in this bit line B. A higher voltage appears at a node ⓑ of the sense amplifier SA than at a node ⓐ. Thereafter, the latch clock $\phi$L rises and transistors Q24 and Q23 are turned on, and the bit line B is set at a predetermined voltage near the ground potential (however, in FIG. 6 this predetermined voltage is given as 0 V by way of simplicity), thereby allowing detection of a difference in voltages between the bit lines B and $\bar{B}$. Subsequently, the lowered voltage at the dummy word line DW0 is increased again to reconnect the capacitor C0 in the dummy cell DM0 to the bit line $\bar{B}$. Substantially at the same time, when a pull-up clock $\phi$P rises, transistors Q25 and Q26 are turned on, so that the voltage at the bit line $\bar{B}$ is feedback-amplified to the VDD level or a level close thereto by means of a bootstrap circuit (not shown) and the voltage at the bit line B is feedback-amplified to the ground level. By way of simplicity, in FIG. 6 the bit line $\bar{B}$ is set at the VDD level and the bit line B is set at 0 V. The high-level original data (logic "1") is stored in the memory cell M0. In this case, the dummy cell DM0 is charged with the voltage VDD. The amplified voltage difference between the bit line pair is transmitted to an I/0 circuit (not shown) through a column selection gate and the respective I/0 lines. The gate is activated by the column address clock CAS and the column address signals. The voltage state of the memory cell is detected by a main amplifier (not shown) in the I/0 circuit. The voltage stage is then extracted through a data output line. Subsequently, the word line W0 goes low to disconnect the memory cell M0 from the bit line $\bar{B}$. The read/rewrite cycle is then completed, and the memory is set in the ready state.

Figure 6:
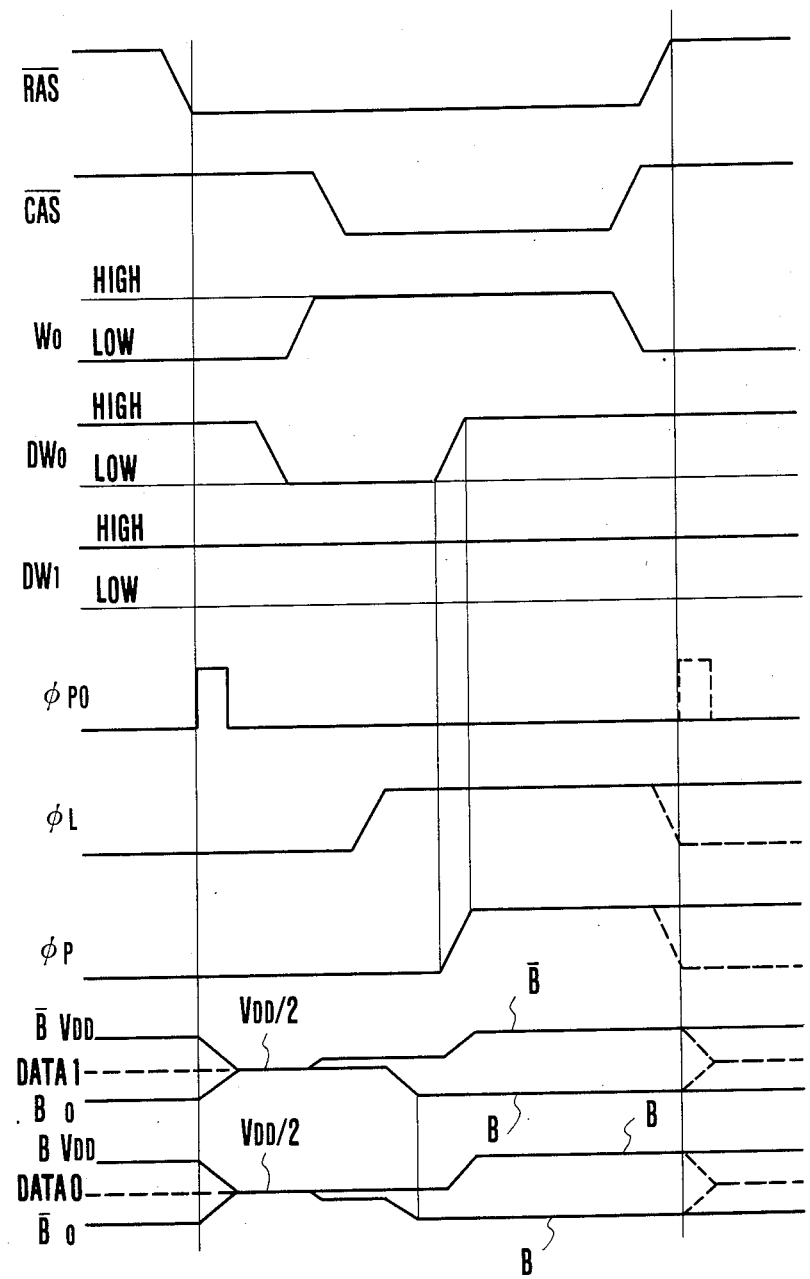
FIG. 6 is a timing chart for explaining the operation of the circuit shown in FIG. 4.

On the other hand, when data of logic "O" has been written in the memory cell M0, the operation is represented by the lowermost waveform shown in FIG. 6. More specifically, when the memory cell M0 is selected by the word line W0, the bit line $\bar{B}$ is set at a voltage which falls below the VDD/2 level and become slightly lower than VDD/2. When the sense amplifier SA is energized, the voltage at the bit line $\bar{B}$ comes closer to zero. By the pull-up effect, the voltages at the bit lines B and $\bar{B}$ come closer to the VDD and ground levels, respectively, thereby performing the readout operation in the same manner as described above.

As is apparent from the above description, the VDD/2 precharge system is adopted in this embodiment. Nevertheless, the capacitances of the bit lines can be balanced and the word line coupling noise is cancelled out.

Figure 1:
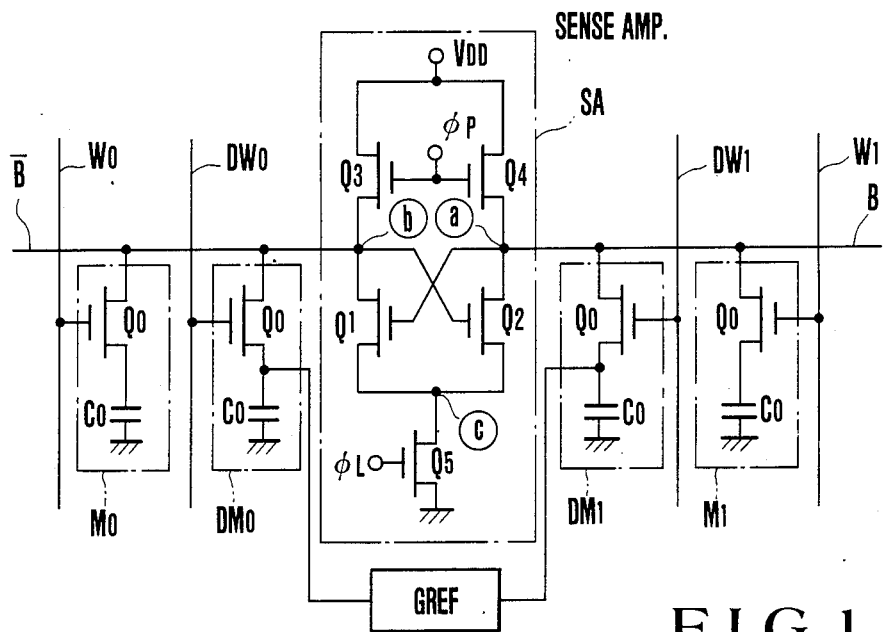
FIGS. 1 to 3 are circuit diagrams showing the main parts of conventional semiconductor memories, respectively.
Figure 2:
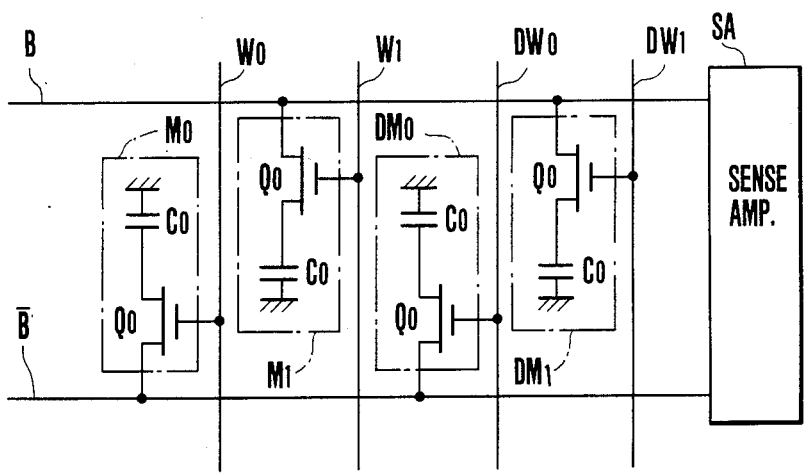
Figure 3:
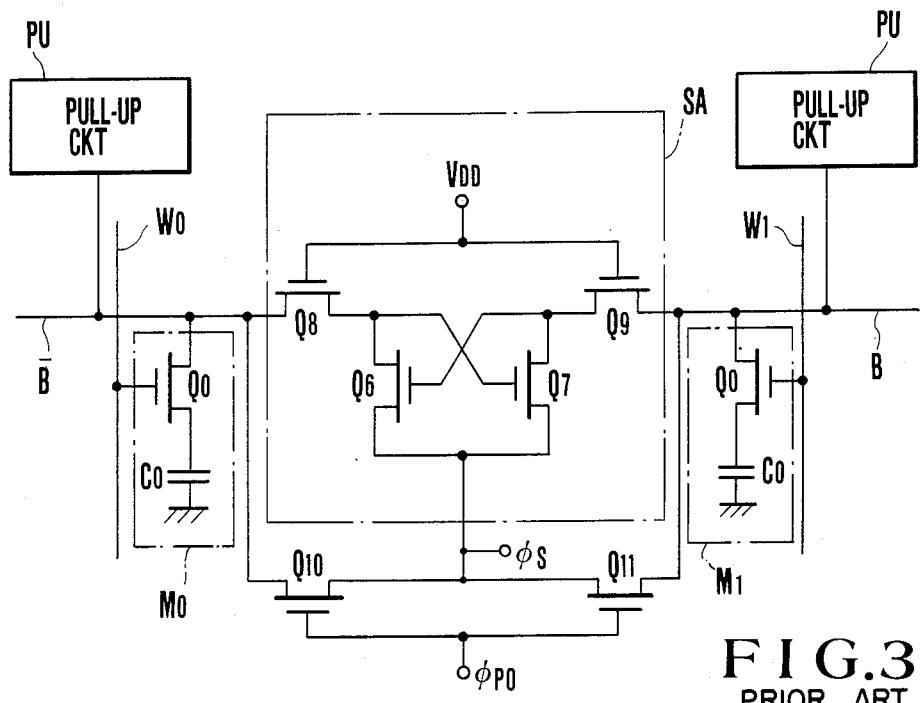

The VDD/2 precharge operation is performed at the beginning of the read/write access such that a transistor switch connects the bit lines B (previously set at the VDD level) to the bit line $\bar{B}$ (previously set at the ground level). In this manner, only a simple circuit with low power consumption is needed to set the bit lines B and $\bar{B}$ at VDD/2 at high speed. In this embodiment, the same operation can be performed as in the case in FIG. 3 wherein the bit lines B and $\bar{B}$ are electrically connected to each other at the end of the read/write cycle to maintain them both at the VDD/2. In this case, the waveforms of the signals are indicated by dotted lines in FIG. 6. However, in this case, it is very difficult to accurately hold the bit line pair at the VDD/2 level for a long period of time since the circuit does not have a means for compensating for the leakage current through a p-n junction connected to a corresponding bit line or a noise current generated by alhpa particles injected in the p-n junction. However, according to the embodiment shown by the solid lines in FIG. 6, the bit line pair is set at the VDD/2 level in accordance with the VDD level and the ground level immediately after the memory is accessed. Since the VDD level and the ground level can be stably held, precise memory operation can be performed such that the VDD/2 level can be stably held for a predetermined period of time.

In this embodiment, the high-level state is achieved simply by keeping the clock $\phi P$ high to keep a transistor Q25 ON. In order to reduce power consumption, it is favorable that the bit lines are connected to the power supply VDD through a high impedance and the clock $\phi P$ after setting the bit line $\overline{B}$ at the VDD level is falling to the ground or low level, thereby turning off the transistor Q25, as indicated by the dotted line.

The capacitances (given as CB in equation (1)) of the bit lines are properly balanced as follows. When the bit lines are being precharged at the VDD/2 level, the capacitor of the dummy cell DM0 is connected to the bit line $\overline{B}$, and the capacitor of the dummy cell DM1 is connected to the bit line B. The capacitances (CB+C0) of the bit lines B and $\overline{B}$ are the same. Before the memory cell M0 is selected, the capacitor of the dummy cell DM0 is disconnected from the bit line $\overline{B}$, while the capacitor of the dummy cell DM1 is still connected to the bit line B. The capacitances (CB+C0) of the bit line pair are thus still the same.

Furthermore, word line coupling noise can be reduced in the following manner. The noise through the coupling capacitances between the word line W0 and the bit line $\overline{B}$ and between the dummy word line DW1 and the bit line B may cause unstable memory operation. However, these coupling capacitances have substantially the same magnitude and noise components have opposite polarity and are thereby cancelled each other. As a result, the noise caused by the coupling capacitances does not present a serious problem.

Furthermore, according to the present invention, the sense amplifier SA is directly connected to the pair of bit lines, as shown in FIG. 5. Unlike in the arrangement in FIG. 3, the transfer gate transistors (Q8 and Q9 in FIG. 3) can be omitted. This is because balance between the bit line capacitances is maintained. Thus according to this invention, the memory can be operated irrespective of the presence/absence of the transfer gates.

According to the present invention, the dummy cells have the same construction as the memory cells. For this reason, special handling is not required. For example, the dummy capacitance need not be reduced to 50% that of the memory cell.

Figure 7:
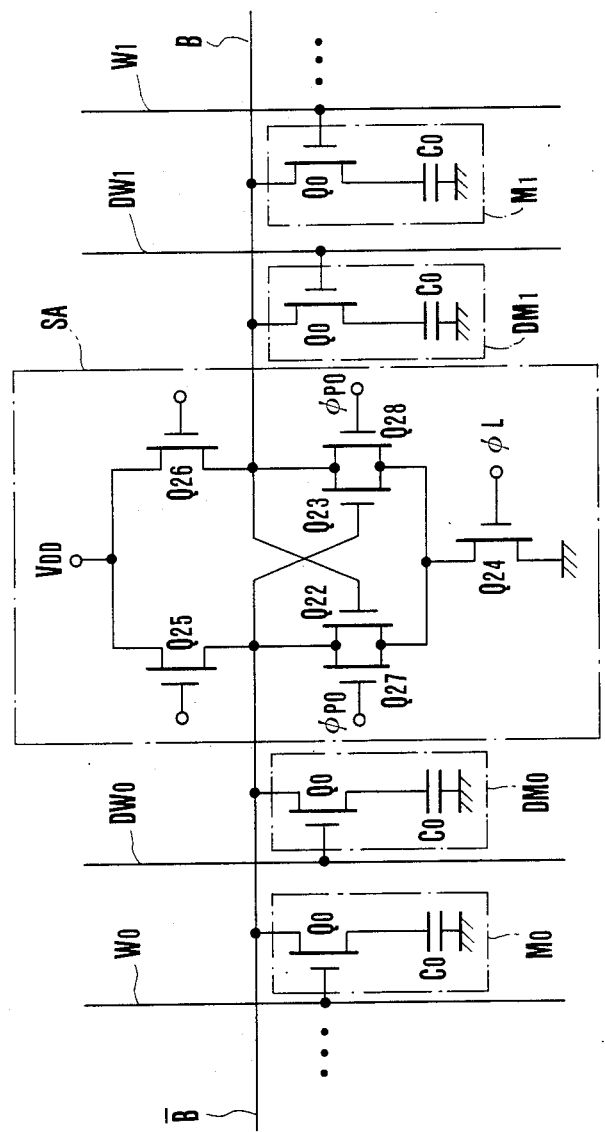

FIG. 7 is a circuit diagram showing a memory according to a second embodiment of the present invention. The pair of bit lines are connected to both sides of a sense amplifier SA, respectively. In other words, an open bit line system is applied to the memory. In addition, the folded bit line system can be employed in this memory, or a combination of the folded and open bit line systems can be adopted in the memory. The same reference numerals used in FIG. 7 denote the same parts in FIGS. 4 and 5, and a detailed description thereof will thus be omitted. The memory of the second embodiment (FIG. 7) is substantially the same as that of the first embodiment (FIGS. 4 and 5), except that the transistor Q21 (FIG. 4) is replaced with transistors Q27 and Q28 which are respectively connected in parallel with transistors Q22 and Q23 of the sense amplifier SA.

As may be apparent from the first and second embodiments, the bit line arrangement is not limited to one of the sides of the sense amplifier. The folded bit line system or the open bit line system can be adopted as needed.

Figure 8:
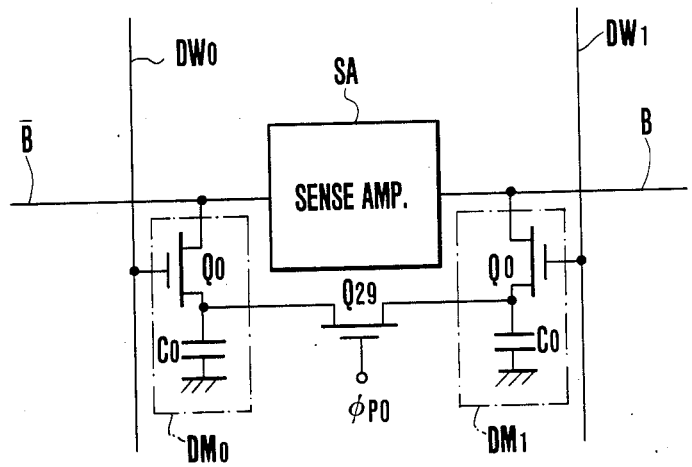
FIGS. 7 and 8 show the main parts of memories according to other embodiments of the present invention.

The dummy cell transistor can be used as a substitute or an auxiliary element for the transistors Q27 and Q28. As shown in FIG. 8, a common node between a transistor Q0 and a cell capacitor C0 of the dummy cell DM0 connected to a dummy word line DW0 is connected through a transistor Q29 to a common node between a transistor Q0 and a cell capacitor C0 of the dummy cell DM1 connected to a dummy word line DW1. Since the dummy word lines are normally held at a high level to keep the transistors of the dummy cells ON, when the clock $\phi P0$ increases and turns on the transistor Q29, the bit lines B and $\overline{B}$ are electrically connected. Therefore, the capacitances of the bit lines can be balanced for a short period of time. In this case, it is favorable that the capacitance of the dummy cell capacitor C0 is reduced to an extent that the overall capacitance C0 and the parasitic capacitance due to the addition of the transistor Q29 becomes substantially equal to the capacitance of the memory cell capacitor. This means can be used independently, or in combination with the transistor Q21 (FIG. 4) so as to perform high-speed precharging or with the transistors Q27 and Q28 (FIG. 7) so as to compensate for the operation thereof.

In the above description, the circuit is limited to the arrangement which includes a pair of bit lines, corresponding dummy word lines, dummy cells, two word lines and the memory cells corresponding thereto. However, the present invention can be applied to a memory having a size of M rows×N columns.

A clock system for operating the circuit in accordance with the timing chart in FIG. 6 is omitted. However, a known clock system can be used as needed.

According to the present invention as described above, a high-speed VDD/2 precharge system of low power consumption can be achieved with a simple arrangement. At the same time, imbalance between the capacitances of the bit lines, and word line coupling noise caused by the capacitive coupling between the word line and the bit line can both be eliminated. In addition, since the leakage current or alpha particle noise with respect to the bit lines can be reduced, a high-performance, stable semiconductor memory can be obtained wherein the power consumption can be reduced to ½ that of the VDD precharge system and erroneous operation caused by noise can be eliminated.

What is claimed is:

1. A semiconductor memory comprising:
   (a) at least a pair of bit lines;
   (b) a plurality of word lines and a pair of dummy word lines which cross said pair of bit lines;
   (c) memory cells arranged in the vicinities of intersections between one of said pair of bit lines and said plurality of word lines, each of said memory cells including a transistor, a gate of which is connected to a corresponding one of said plurality of word lines, a first terminal of which is connected to a corresponding one of said pair of bit lines and a second terminal of which is connected to a capacitive element, and each of said memory cells being arranged to store one of first and second voltage states in response to a write signal;

(d) a pair of dummy cells respectively coupled to said pair of bit lines and said pair of dummy word lines, each of said dummy cells having substantially the same construction as each of said memory cells and including a transistor and a capacitive element, the capacitive element of each of said dummy cells being adapted to be connected to only one of said pair of bit lines;

(e) means coupled to said pair of dummy word lines for rendering said transistors of said pair of dummy cells conducting;

(f) means for connecting said pair of bit lines to each other at a predetermined timing when both of the transistors in said pair of dummy cells are conducting, to thereby set said pair of bit lines at a third voltage state said third voltage state being an intermediate potential value between said first and second voltage states;

(g) means, responsive to an address signal, for connecting a capacitive element in a selected one of said memory cells to one of said pair of bit lines by means of a selected one of said word lines and disconnecting said capacitive element in one of said dummy cells from that one of said pair of bit lines, while maintaining the connection between said capacitive element in the other dummy cell and the other of said pair of bit lines; and (h) means for differentially detecting signals on said pair of bit lines.

2. A memory according to claim 1, which further comprises:

means for amplifying the signals on said pair of bit lines and setting the one of said pair of bit lines at a fourth voltage state and the other of said pair of bit lines at a fifth voltage state; and means for disconnecting said capacitive element of said selected memory cell from the one of said pair of memory cells after the signals on said pair of bit lines are amplified.

3. A memory according to claim 1, wherein said means for connecting said pair of bit lines sets said pair of bit lines at the third voltage state after said memory receives an access signal.

4. A memory according to claim 1, wherein said means for connecting said pair of bit lines sets said pair of bit lines at the third voltage state after said capacitive element of said selected memory cell is disconnected from the one of said pair of bit lines.

5. A memory according to claim 1, wherein said means for connecting said pair of bit lines includes means for connecting second terminals of said transistors in said dummy cells to each other.

6. A semiconductor memory comprising a pair of bit lines arranged in parallel;

a plurality of word lines and a pair of dummy word lines intersecting with said pair of bit lines;

a plurality of memory cells, each of said memory cells including a capacitive element having a first end connected to a predetermined potential and a transistor having a source-drain path coupled between one of said pair of bit lines and a second end of said capacitive element and a gate coupled to one of said word lines, each of said memory cells being adapted to store one of first and second potentials;

a pair of dummy cells respectively coupled to said pair of bit lines and said pair of dummy word lines, each of said dummy cells having substantially the same construction as said memory cells;

first means for connecting said pair of bit lines to each other under such condition that said pair of bit lines are electrically isolated from any potential source thereby to establish a third potential on said pair of bit lines, said third potential being of an intermediate value between said first and second potential;

second means coupled to said pair of dummy word lines for operatively rendering the transistors of said pair of dummy cells conductive to thereby store said third potential on said pair of bit lines in capacitive elements in said pair of dummy cells;

third means responsive to address information for selecting one of said word lines to thereby connect a capacitive element of the memory cell coupled to the selected word line to one of said pair of bit lines;

fourth means for operatively selecting one of said pair of dummy word lines, said one dummy word line being connected to one of said dummy memory cells connected to the other of said pair of bit lines;

fifth means for differentially detecting signals on said pair of bit lines.

7. A memory according to claim 6, in which said fifth means includes a first sense transistor having a source-drain path coupled between a first node and a common node and a gate connected to a second node, a second sense transistor having a source-drain path coupled between said second node and said common node and a gate connected to said first node, means for connecting said first node to one of said pair of bit lines and means for connecting said second node to the other of said pair of bit lines.

8. A memory according to claim 7, in which said first means includes a first connection transistor having a source-drain path coupled between one of said pair of bit lines and said common node, and a second connection transistor having a source-drain path coupled between the other of said pair of bit lines and said common node.

9. A memory according to claim 6, in which said first means includes a transistor having a source-drain path coupled between second ends of said second capacitive elements.

10. A semiconductor memory comprising a pair of bit lines arranged in parallel;

a plurality of word lines and a pair of dummy word lines intersecting with said pair of bit lines;

a plurality of memory cells, each of said memory cells including a capacitive element having a first end connected to a predetermined potential and a transistor having a source-drain path coupled between one of said pair of bit lines and a second end of said capacitive element and a gate coupled to one of said word lines, each of said memory cells being adapted to store one of first and second potentials;

a pair of dummy cells respectively coupled to said pair of bit lines and said pair of dummy word lines, each of said dummy cells having substantially the same construction as said memory cells;

first means for connecting said pair of bit lines to each other under such condition that said pair of bit lines are electrically isolated from any potential source to thereby establish a third potential on said pair of bit lines, said third potential being of an intermediate value between said first and second potential, said first means including a first connection transistor having a source-drain path coupled between one of said pair of bit lines and said common node, and a second connection transistor having a source-drain path coupled between the other of said pair of bit lines and said common node;

second means coupled to said pair of dummy word lines for operatively rendering the transistors of said pair of dummy cells conductive to thereby store said third potential on said pair of bit lines in capacitive elements in said pair of dummy cells;

third means responsive to address information for selecting one of said word lines to thereby connect a capacitive element of the memory cell coupled to the selected word line to one of said pair of bit lines;

fourth means for operatively selecting one of said pair of dummy word lines, said one dummy word line being connected to one of said dummy memory cell connected to the other of said pair of bit lines;

fifth means for differentially detecting signals on said pair of bit lines, said fifth means including a first sense transistor having a source-drain path coupled between a first node and a common node and a gate connected to a second node, a second sense transistor having a source-drain path coupled between said second node and said common node and a gate connected to said first node, means for connecting said first node to one of said pair of bit lines and means for connecting said second node to the other of said pair of bit lines.

11. A semiconductor memory comprising a pair of bit lines aranged in parallel;

a plurality of word lines and a pair of dummy word lines intersecting with said pair of bit lines;

a plurality of memory cells, each of said memory cells including a capacitive element having a first end connected to a predetermined potential and a transistor having a source-drain path coupled between one of said pair of bit lines and a second end of said capacitive element and a gate coupled to one of said word lines, each of said memory cells being adapted to store one of first and second potentials;

a pair of dummy cells respectively coupled to said pair of bit lines and said pair of dummy word lines, each of said dummy cells having substantially the same construction as said memory cells, a capacitive element of each of said dummy cells being adapted to be connected only to one of said pair of bit lines;

first means for operatively setting said pair of bit lines at a third potential, said third potential being of an intermediate potential between said first and second potentials;

second means coupled to said pair of dummy word lines for operatively rendering transistors of said pair of dummy cells conductive to thereby store said third potential on said pair of bit lines to capacitive elements of said pair of dummy cells, third means responsive to address information for selecting one of said word lines to thereby connect a capacitive element of the memory cells coupled to the selected word line to one of said pair of bit lines;

fourth means for operatively selecting one of said pair of dummy word lines, said one dummy word line being connected to one of said dummy cells connected to the other of said pair of bit lines; and fifth means for differentially detecting signal on said pair of bit lines.

* * * * *

UNITED STATES PATENT AND TRADEMARK OFFICE
CERTIFICATE OF CORRECTION

PATENT NO. : 4,622,655

DATED : November 11, 1986

INVENTOR(S) : Shunichi SUZUKI

It is certified that error appears in the above-identified patent and that said Letters Patent is hereby corrected as shown below:

Column 1, Line 33, delete "and", and insert therefor --or--

Column 1, Line 67, delete "+0.3", and insert therefor --$\pm 0.3$--

Column 2, Line 1, delete "+2.5", and insert therefor --$\pm 2.5$--.

Signed and Sealed this

Twenty-fourth Day of March, 1987

Attest:

DONALD J. QUIGG

*Attesting Officer*     *Commissioner of Patents and Trademarks*